United States Patent
Abu-Surra et al.

(10) Patent No.: US 8,627,166 B2
(45) Date of Patent: Jan. 7, 2014

(54) LDPC CODE FAMILY FOR MILLIMETER-WAVE BAND COMMUNICATIONS IN A WIRELESS NETWORK

(75) Inventors: Shadi Abu-Surra, Richardson, TX (US);
Thomas M. Henige, Plano, TX (US);
Eran Pisek, Plano, TX (US); Zhouyue Pi, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 87 days.

(21) Appl. No.: 13/306,747

(22) Filed: Nov. 29, 2011

(65) Prior Publication Data
US 2012/0240001 A1 Sep. 20, 2012

Related U.S. Application Data

(60) Provisional application No. 61/453,399, filed on Mar. 16, 2011, provisional application No. 61/467,185, filed on Mar. 24, 2011.

(51) Int. Cl.
*H03M 13/00* (2006.01)

(52) U.S. Cl.
USPC .......................................................... 714/752

(58) Field of Classification Search
None
See application file for complete search history.

(56) References Cited

U.S. PATENT DOCUMENTS

| | | | |
|---|---|---|---|
| 8,245,107 B2 * | 8/2012 | Sanderovich | 714/758 |
| 2010/0199143 A1 * | 8/2010 | Sanderovich | 714/752 |
| 2010/0329308 A1 * | 12/2010 | Kim et al. | 375/130 |
| 2012/0084625 A1 * | 4/2012 | Pisek et al. | 714/757 |

* cited by examiner

*Primary Examiner* — Guerrier Merant

(57) ABSTRACT

A method constructs a family of low-density-parity-check (LDPC) codes. The method includes identifying a code rate for an LDPC code in the family, identifying a protograph for the LDPC code, and constructing a base matrix for the LDPC code. The base matrix is constructed by replacing each zero in the protograph with a '−1', selecting a corresponding value for an absolute shift for each one in the protograph based on constraining a number of relative shifts per column of the LDPC code to one and increasing a size of a smallest cycle in a graph of the LDPC code, and replacing each one in the protograph with the corresponding value.

20 Claims, 9 Drawing Sheets

“LDPC CODE FAMILY FOR MILLIMETER-WAVE BAND COMMUNICATIONS IN A WIRELESS NETWORK”

CROSS-REFERENCE TO RELATED APPLICATION(S) AND CLAIM OF PRIORITY

The present application is related to U.S. Provisional Patent Application No. 61/453,399, filed Mar. 16, 2011, entitled "HIGH-THROUGHPUT LOW-POWER LDPC CODES WITH LENGTHS 432 AND 1728" and U.S. Provisional Patent Application No. 61/467,185, filed Mar. 24, 2011, entitled "LOW-RATE LDPC CODES FOR NEXT GENERATION COMMUNICATION SYSTEMS". Provisional Patent Application Nos. 61/453,399 and 61/467,185 are assigned to the assignee of the present application and is hereby incorporated by reference into the present application as if fully set forth herein. The present application hereby claims priority under 35 U.S.C. §119(e) to U.S. Provisional Patent Application Nos. 61/453,399 and 61/467,185.

TECHNICAL FIELD OF THE INVENTION

The present application relates generally to wireless communication systems and, more specifically, to encoding and decoding data transmitted in a wireless communication system.

BACKGROUND OF THE INVENTION

The rise of high definition and 3D media, the vision of hyper-connectivity, and the shift toward cloud computing have prompted the need for gigabit wireless communication systems. However, implementing high data-rate systems poses a number of engineering challenges. One of the main challenging problems is the design of a high throughput error control scheme.

Low-density-parity-check (LDPC) codes are channel codes used in forward-error-correcting (FEC) schemes. LDPC codes are well known for their good performance and have received a great deal of attention in recent years. This is due to their ability to achieve performance close to the Shannon limit, the ability to design codes which achieve high parallelization in hardware, and their support of high data rates. Consequently, many of the currently active telecommunication standards have LDPC codes in their physical layer FEC scheme.

As data rates in modern communication systems and battery-powered mobile communication and computing devices usage increase, low-power hardware design has become more important. As a result, there is continuing work in the area of improving the power-efficiency and throughput of LDPC encoding and decoding hardware.

Proposed next generation wireless communication systems utilize the extremely high frequencies (EHF) bands. The EHF band includes a range of radio frequencies from around 30 to 300 GHz. The EHF band has wavelengths in the order of a few millimeters. As a result, the band is commonly referred to as the millimeter-wave band (MMB).

Therefore, there is a need for standards of communication in proposed next generation wireless communication systems. In particular, there is a need for an LDPC code family for MMB communications in a wireless network.

SUMMARY OF THE INVENTION

A method for constructing a family of low-density-parity-check (LDPC) codes is provided. The method includes identifying a code rate for an LDPC code in the family, identifying a protograph for the LDPC code, and constructing a base matrix for the LDPC code. The base matrix is constructed by replacing each zero in the protograph with a '−1', selecting a corresponding value for an absolute shift for each one in the protograph based on constraining a number of relative shifts per column of the LDPC code to one and increasing a size of a smallest cycle in a graph of the LDPC code, and replacing each one in the protograph with the corresponding value.

A decoder configured to decode a low-density-parity-check (LDPC) codeword is provided. The decoder includes a storage device configured to receive the LDPC codeword, and a check node processor configured to decode the LDPC codeword by iteratively processing layers of an LDPC code. The LDPC code is constructed by determining a protograph for the LDPC code, and constructing a base matrix for the LDPC code. The base matrix is constructed by replacing each zero in the protograph with a '−1', selecting a corresponding value for an absolute shift for each one in the protograph based on constraining a number of relative shifts per column of the LDPC code to one and increasing a size of a smallest cycle in a graph of the LDPC code, and replacing each one in the protograph with the corresponding value.

A method for constructing a low-rate low-density-parity-check (LDPC) code is provided. The method includes concatenating a number of information bits with a number of zeros to form a set of concatenated bits, encoding the concatenated bits using an encoder configured to encode LDPC codewords having a code rate that is larger than the code rate of the low-rate LDPC code to form an LDPC codeword, and replacing the zeros in the LDPC codeword with the information bits.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 6A&B illustrate rate 13/16 LDPC codes of lengths 432 and 1728 in accordance with the present disclosure;

FIGS. 7A&B illustrate rate 5/8 LDPC codes of lengths 432 and 1728 in accordance with an illustrative embodiment of the present disclosure;

FIGS. 8A&B illustrate rate 1/2 LDPC codes of lengths 432 and 1728 in accordance with an illustrative embodiment of the present disclosure;

FIGS. 9A&B illustrate rate 3/8 LDPC codes of lengths 432 and 1728 in accordance with an illustrative embodiment of the present disclosure;

DETAILED DESCRIPTION OF THE INVENTION

FIGS. 1 through 15, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communications system.

Figure 1:
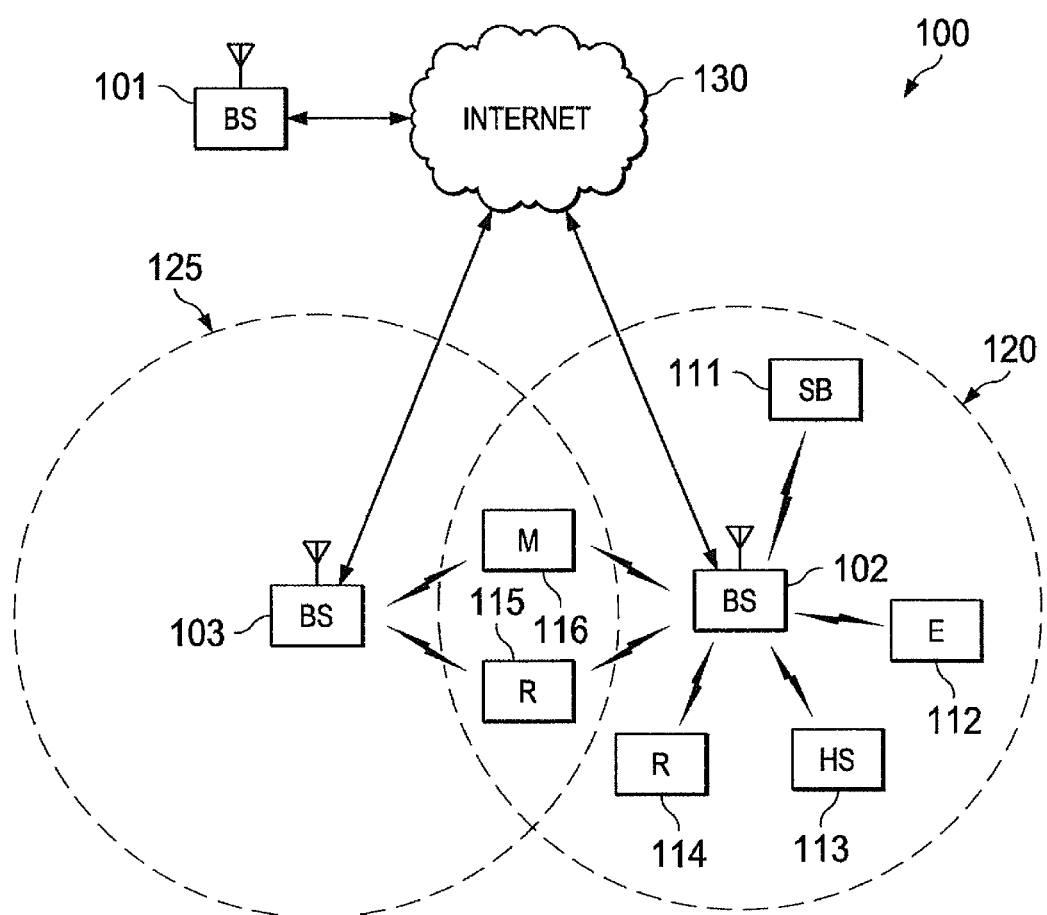
FIG. 1 illustrates an exemplary wireless system which transmits messages in accordance with an illustrative embodiment of the present disclosure.
Figure 2:
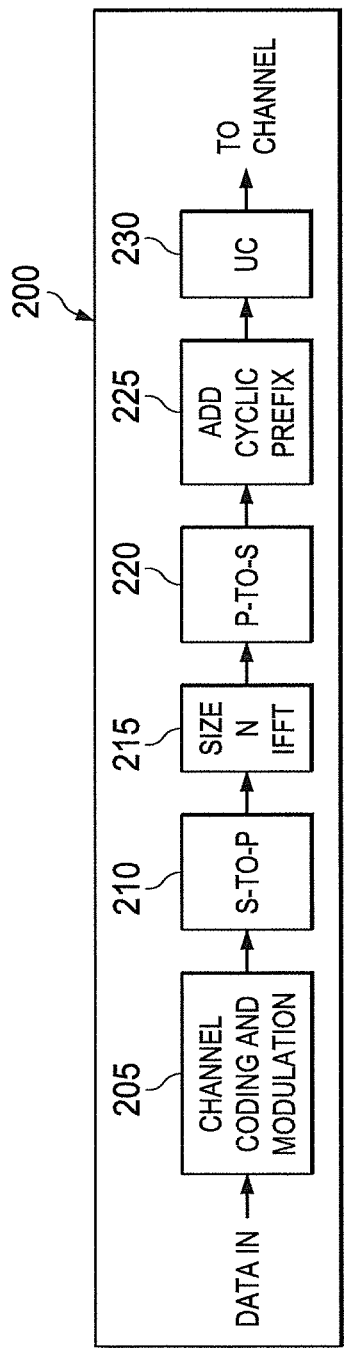
FIG. 2 illustrates a high-level diagram of an orthogonal frequency division multiple access transmit path in accordance with an illustrative embodiment of the present disclosure.
Figure 3:
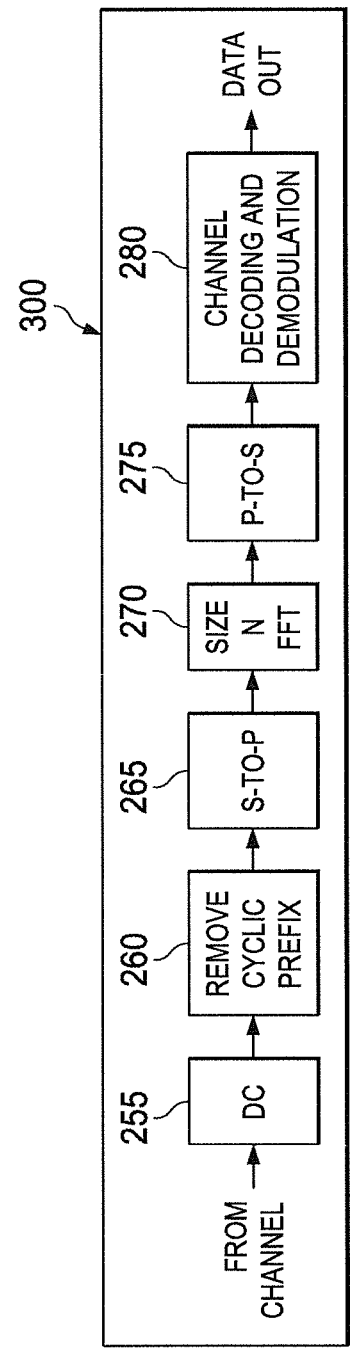
FIG. 3 illustrates a high-level diagram of an orthogonal frequency division multiple access receive path in accordance with an illustrative embodiment of the present disclosure.

FIGS. 1-3 below describe various embodiments implemented in wireless communications systems and with the use of OFDM or OFDMA communication techniques. The description of FIGS. 1-3 is not meant to imply physical or architectural limitations to the manner in which different embodiments may be implemented. Different embodiments of the preset disclosure may be implemented in any suitably arranged communications system.

FIG. 1 illustrates exemplary wireless system 100, which transmits messages according to the principles of the present disclosure. In the illustrated embodiment, wireless system 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based system (not shown).

Base station 102 provides wireless broadband access (via base station 101) to Internet 130 to a first plurality of subscriber stations within coverage area 120 of base station 102. The first plurality of subscriber stations includes subscriber station 111, which may be located in a small business (SB), subscriber station 112, which may be located in an enterprise (E), subscriber station 113, which may be located in a WiFi hotspot (HS), subscriber station 114, which may be located in a first residence (R), subscriber station 115, which may be located in a second residence (R), and subscriber station 116, which may be a mobile device (M), such as a cell phone, a wireless laptop, a wireless PDA, or the like.

Base station 103 provides wireless broadband access (via base station 101) to Internet 130 to a second plurality of subscriber stations within coverage area 125 of base station 103. The second plurality of subscriber stations includes subscriber station 115 and subscriber station 116. In an exemplary embodiment, base stations 101-103 may communicate with each other and with subscriber stations 111-116 using OFDM or OFDMA techniques.

While only six subscriber stations are depicted in FIG. 1, it is understood that wireless system 100 may provide wireless broadband access to additional subscriber stations. It is noted that subscriber station 115 and subscriber station 116 are located on the edges of both coverage area 120 and coverage area 125. Subscriber station 115 and subscriber station 116 each communicate with both base station 102 and base station 103 and may be said to be operating in handoff mode, as known to those of skill in the art.

Subscriber stations 111-116 may access voice, data, video, video conferencing, and/or other broadband services via Internet 130. In an exemplary embodiment, one or more of subscriber stations 111-116 may be associated with an access point (AP) of a WiFi WLAN. Subscriber station 116 may be any of a number of mobile devices, including a wireless-enabled laptop computer, personal data assistant, notebook, handheld device, or other wireless-enabled device. Subscriber stations 114 and 115 may be, for example, a wireless-enabled personal computer (PC), a laptop computer, a gateway, or another device.

FIG. 2 is a high-level diagram of an orthogonal frequency division multiple access (OFDMA) transmit path. FIG. 3 is a high-level diagram of an orthogonal frequency division multiple access (OFDMA) receive path. In FIGS. 2 and 3, the OFDMA transmit path is implemented in base station (BS) 102 and the OFDMA receive path is implemented in subscriber station (e.g. subscriber station 116 of FIG. 1), and the OFDMA receive path 300 may be implemented in a base station (e.g. base station 102 of FIG. 1) for the purposes of illustration and explanation only.

Transmit path 200 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. Receive path 300 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2 and 3 may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

In transmit path 200, channel coding and modulation block 205 receives a set of information bits, applies coding (e.g., LDPC coding) and modulates (e.g., Quadrature Phase Shift Keying (QPSK) or Quadrature Amplitude Modulation (QAM)) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and SS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at SS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Each of base stations 101-103 may implement a transmit path that is analogous to transmitting in the downlink to subscriber stations 111-116 and may implement a receive path that is analogous to receiving in the uplink from subscriber stations 111-116. Similarly, each one of subscriber stations 111-116 may implement a transmit path corresponding to the architecture for transmitting in the uplink to base stations 101-103 and may implement a receive path corresponding to the architecture for receiving in the downlink from base stations 101-103.

The different illustrative embodiments of the present disclosure recognize and take into account that resource blocks (RB) in the proposed frame structure for millimeter-wave mobile communications include 432 data modulation symbols and each subband consists of four RBs. Accordingly, the different illustrative embodiments of the present disclosure provide several LDPC codes with lengths 432 and 1728. The different illustrative embodiments of the present disclosure include several design constraints that facilitate high-throughput low-power decoder architecture.

Figure 4:
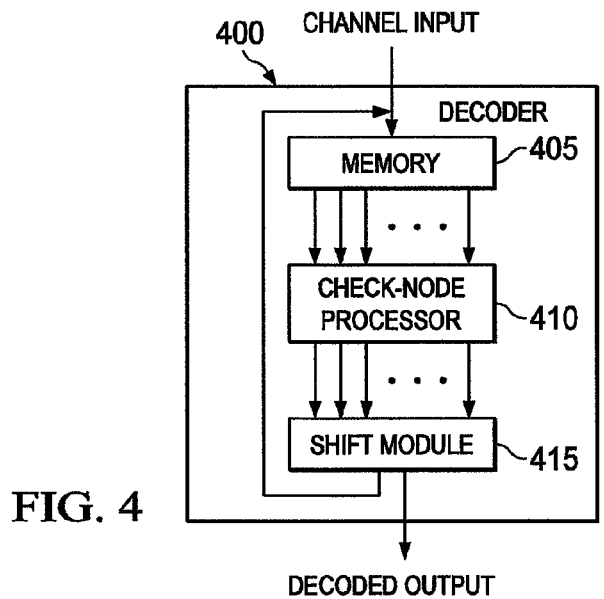
FIG. 4 illustrates a decoder in accordance with an illustrative embodiment of the present disclosure.

FIG. 4 illustrates a decoder in accordance with an illustrative embodiment of the present disclosure. In this illustrative example, decoder 400 is a decoder for decoding LDPC codes of various rates and lengths provided in the illustrative embodiments of the present disclosure. For example, a subscriber station or base station may transmit LDPC codewords in a wireless network. Decoder 400 receives and decodes the transmitted codeword.

Memory 405 stores channel inputs received at decoder 400. Check-node processor 410 iteratively processes layers of the LDPC code to decode the transmitted codeword. For example, check-node processor 410 has a number of inputs for processing columns in a single row or layer of a received codeword. Shift module 415 cyclically shifts processed layer for processing of additional layers by check-node processor 410. Once each layer has been processed, the decoded codeword is output by decoder 400.

In designing the LDPC codes of the present disclosure, the present disclosure includes several design constraints to facilitate high-throughput low-power decoder architecture. For example, the different illustrative embodiments recognize that utilization of the critical path in check-node processor 410 is important. The critical path is the number of processing stages that must be completed to process a single layer of LDPC code. The larger the length of the critical path the longer clock cycle period used and lower the throughput of decoder 400.

The critical path of check-node processor 410 is proportional to the value given in Equation 1 below.

$$2^{ceil(\log_2(c))} \qquad \text{Equation 1.}$$

where 'c' is the number of the variable nodes (VNs) or columns present in the protograph of the LDPC code. As a result, choosing 'c' as a power of two provides the best utilization of the critical bath. Accordingly, different illustrative embodiments of present provide 16 columns in the design of the LDPC codes.

Additionally, the present disclosure recognizes that limiting the number of layers processed by check-node processor 410 can improve the throughput and power efficiency of decoder 400. Accordingly, different illustrative embodiments of present provide LDPC codes having a column weight of less than or equal four with the designed codes being 4-layer decodable. The column weight is the number of non '−1' values present in a given column. In other words, while codes of different rates may have different numbers of rows, some rows can be processed in parallel such that the code can be decoded in four layers, hence, 4-layer decodable.

Different illustrative embodiments of the present disclosure also recognize that use of the same decoder hardware to decode LDPC codes of different rates can result in component cost and size savings. As a result, in some embodiments, shift module 415 can implement all possible shifts between the rows of the base matrices of the designed LDPC codes. Additionally, reducing the number of relative shifts per column reduces the critical path for decoder 400. A relative shift is a shift between successive rows of a column. In decoder 400, constraining the number of relative shifts per column simplifies the architecture of the shifting elements in shifting module 415. For example, multiplexers created from CMOS logic or pass-transistor logic may perform the shifts in shifting module 415. Additional, increasing the number of shifts per column performed per layer increases the number of layers of multiplexers performing the shifts. As a result, illustrative embodiments of the present disclosure constrain the number of the relative shifts between circulant blocks in the same column. In some embodiments, the relative shift per column is one.

Additional examples of LDPC decoder design may be found in U.S. patent application Ser. No. 13/248,900 filed on Sep. 29, 2011, and entitled "APPARATUS AND METHOD FOR DECODING LDPC CODES IN A COMMUNICATIONS SYSTEM." U.S. patent application Ser. No. 13/248,900 is assigned to the assignee of the present application and is hereby incorporated by reference into the present application as if fully set forth herein.

The illustration of decoder 400 in FIG. 4 is not meant to imply physical or architectural limitations to the manner in which different advantageous embodiments may be implemented. Other components in addition and/or in place of the ones illustrated may be used. Some components may be unnecessary in some embodiments. For example, one or more shifts may occur before or after decoding of the LDPC codeword.

Figure 5:
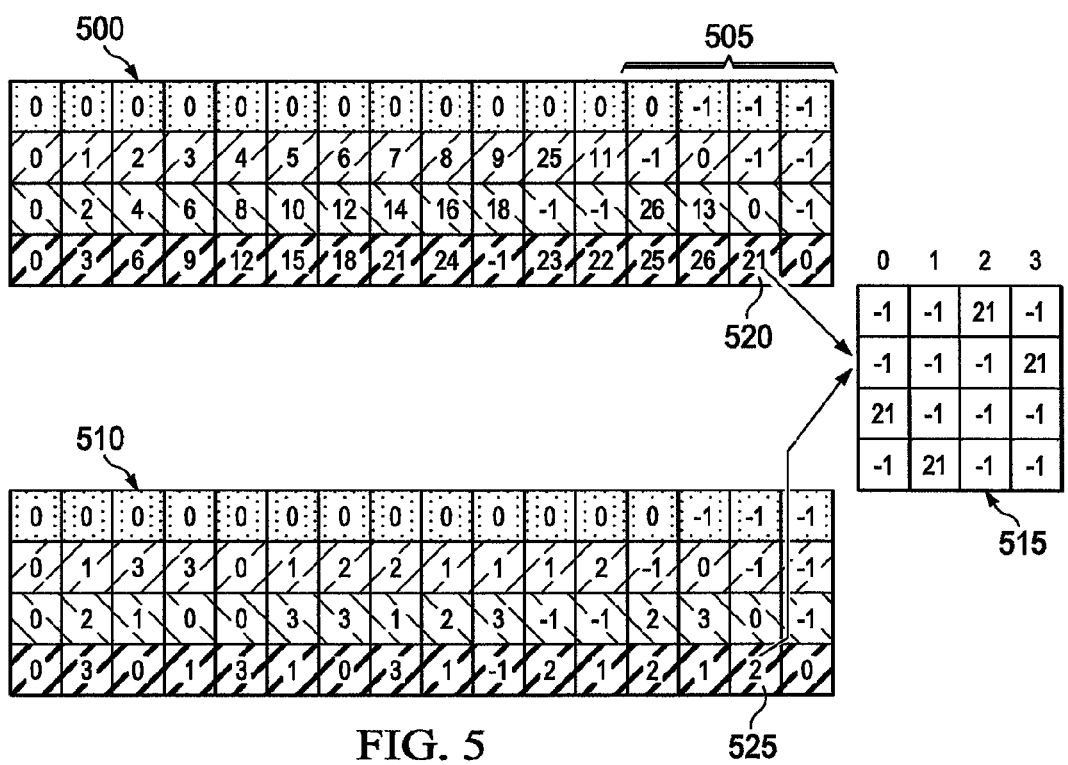
FIG. 5 illustrates rate 3/4 LDPC codes of lengths 432 and 1728 in accordance with an illustrative embodiment of the present disclosure.

FIG. 5 illustrates rate ¾ LDPC codes of lengths 432 and 1728 in accordance with an illustrative embodiment of the present disclosure. Base matrix 500 is an example of rate ¾ LDPC code of lengths 432 designed according to one embodiment of the present disclosure.

In this illustrative embodiment, base matrix 500 has a parallelization factor (or Z factor) of 27. The various values in base matrix 500 are cyclical shift blocks where the value present represents an absolute cyclical shift applied to a 27×27 identity matrix. For example, a base H-matrix designed used Z-factor expansion is guaranteed to have layers (or rows) consisting of Z contention-free parity checks.

The different illustrative embodiments recognize that within each layer there is no sharing of information between parity checks. Therefore, there is a trade-off between parallelization and number of parity checks with Z-factor selection. The higher Z-factor means the code can support greater parallelization, but it constrains the code design by limiting the possibilities of the parity checks and limiting the amount of information passed between the parity checks. The lower Z-factor reduces the constraints on the parity checks but lowers the potential for parallelization. The different illustrative embodiments include LDPC code designs with a Z-factor selected to provide a reasonable amount of parallelization without overly constraining the parity checks and limiting the information shared between the layers.

Embodiments of the present disclosure also provide LDPC code designs that include parity check matrices with a lower triangular structure. As depicted, parity check matrix 505 includes absolute shift values in the lower triangle portion of the parity check matrix 505. Designing parity check matrix 505 to include the lower triangular structure promotes faster encoding.

In accordance with illustrative embodiments of the present disclosure, base matrix 500 for 432 bit length rate-¾ LDPC code with a parallelization factor of 27 may be designed by first generating a protograph based on the design constraints discussed above. The protograph has 16 columns as discussed above. For rate-¾ code one fourth of the code are parity bits. As a result to promote lower triangle structure in parity matrix 505, the photograph includes four rows. Additionally, four rows guarantees that the resulting LDPC code is at least 4-layer decodable. The protograph is designed based on an extrinsic information transfer (EXIT) analysis to achieve a low signal-to-noise ratio (SNR) threshold (i.e., protograph threshold) for successful decoding.

Next the protograph is lifted using one shift per column with the values for the absolute shift in the circulant blocks selected to increase a size of a smallest cycle and increase the minimum distance. A cycle is a closed loop which starts at a given node and returns to the same node in a graph (e.g., Tanner graph) of variable nodes and check nodes. The size of the cycle is the number of nodes required to traverse before returning back to the same node. Increasing the size of the smallest cycle of the LDPC code results in better error performance of the code. The smallest Hamming weight (number of non-zero bits in the codeword) of the codewords in the code is the minimum distance of the LDPC code.

Upon initial assignment of the values for the circulant blocks in base matrix 500, the minimum distance of the code and smallest cycle size is checked. One or more values for the circulant blocks may be modified in accordance with the design constraints to improve the size of the smallest cycle and minimum distance parameters of the LDPC code. This process may be iteratively repeated to improve code design. In this illustrative embodiment, the size of the smallest cycle is six. Such a smallest cycle size may be achieved using assignments other than assignments illustrated by base matrix 500. Base matrix 500 is one example of rate ¾ length 432 LDPC code designed according to the principals of the present disclosure.

As depicted, in base matrix 500 the relative shift between the circulant blocks in any two adjacent rows is the same, if circulant blocks are present in the two rows. As an example, the relative shift between the circulant blocks in any two adjacent rows is zero in the first column. As another example, the relative shift between the circulant blocks in any two adjacent rows is one in the second column. As yet another example, the relative shift between the circulant blocks in any two adjacent rows is 25 in the eleventh column. Note that the dimension of the circulant block is 27 in this example. The circulant block for the 1st row and the 11th column is the identity matrix, as denoted by the number '0'. The circulant block for the 2nd row and the 11th column is the circulant block obtained by cyclically shift the identity matrix by 25 times, as denoted by the number '25'. The circulant block for the 3rd row and the 11th column is the circulant block obtained by cyclically shift the circulant block in the previous row by 25 times, which can be obtained equivalently by cyclically shift the identity matrix by 50 times. Since the dimension of the identity matrix and circulant blocks in this example is 27, the circulant block in the 3rd row and the 11th column can be obtained by cyclically shift the identity matrix by 50−27=23 times, as denoted by the number '23'. This procedure for cyclically shifting past 27 is noted by mod(z) (i.e., 25+25 mod(z)=23).

In another example, permutation of the rows of the parity check matrix results in the same code. As an example, in base matrix 500 exchanging the order of the 1st and the 2nd rows results in the same code.

In another example, permutation of the columns of the parity check matrix results in codes with similar performance and properties. For example, exchanging the first and the second columns in base matrix 500 results in the same minimum distance, SNR threshold, and similar error performance of the code. In another example, replacing the circulant permutations {0, 0, 0, 0} in the first column by the circulant permutations {1, 1, 1, 1}, {2, 2, 2, 2}, or {26, 26, 26, 26} results in the same minimum distance, SNR threshold, and similar error performance of the code. In yet another example, replacing the circulant permutations {0, 1, 2, 3} in the second column by the circulant permutations {1, 2, 3, 4}, {2, 3, 4, 5}, or {26, 0, 1, 2} results in the same minimum distance, SNR threshold, and similar error performance of the code.

For uses requesting multiple RBs, four RBs or one subband can be utilized by 1728-bit length LDPC code. In different illustrative embodiments, 1728-bit length LDPC code can be constructed by lifting base matrix 500 by a factor of four using lifting matrix 510. Lifting matrix 510 includes values for circulant shifts of the values in the circulant blocks in base matrix 510. For example, matrix 515 illustrates circulant block 520 lifted by a factor of four and cyclically shifted twice as shown by block 525. In matrix 515, the value from circulant block 520 '21' is lifted by a factor of four by multiplying the identity matrix for 4×4 by 21. The values in matrix 515 are then cyclically shifted twice to the right according to block 525 resulting in the values displayed in matrix 515. A similar procedure can be applied to each block in base matrix 500 to result in length-1728 LDPC code. Additionally, once constructed, the smallest cycle size and minimum distance in the length-1728 LDPC code can be checked for compliance with design constraints. One or more values in lifting matrix 510 may be adjusted to reduce the number of cycles at the smallest and increase the minimum distance of the length-1728 LDPC code.

Figures 6A, 6B, 7A, 7B:
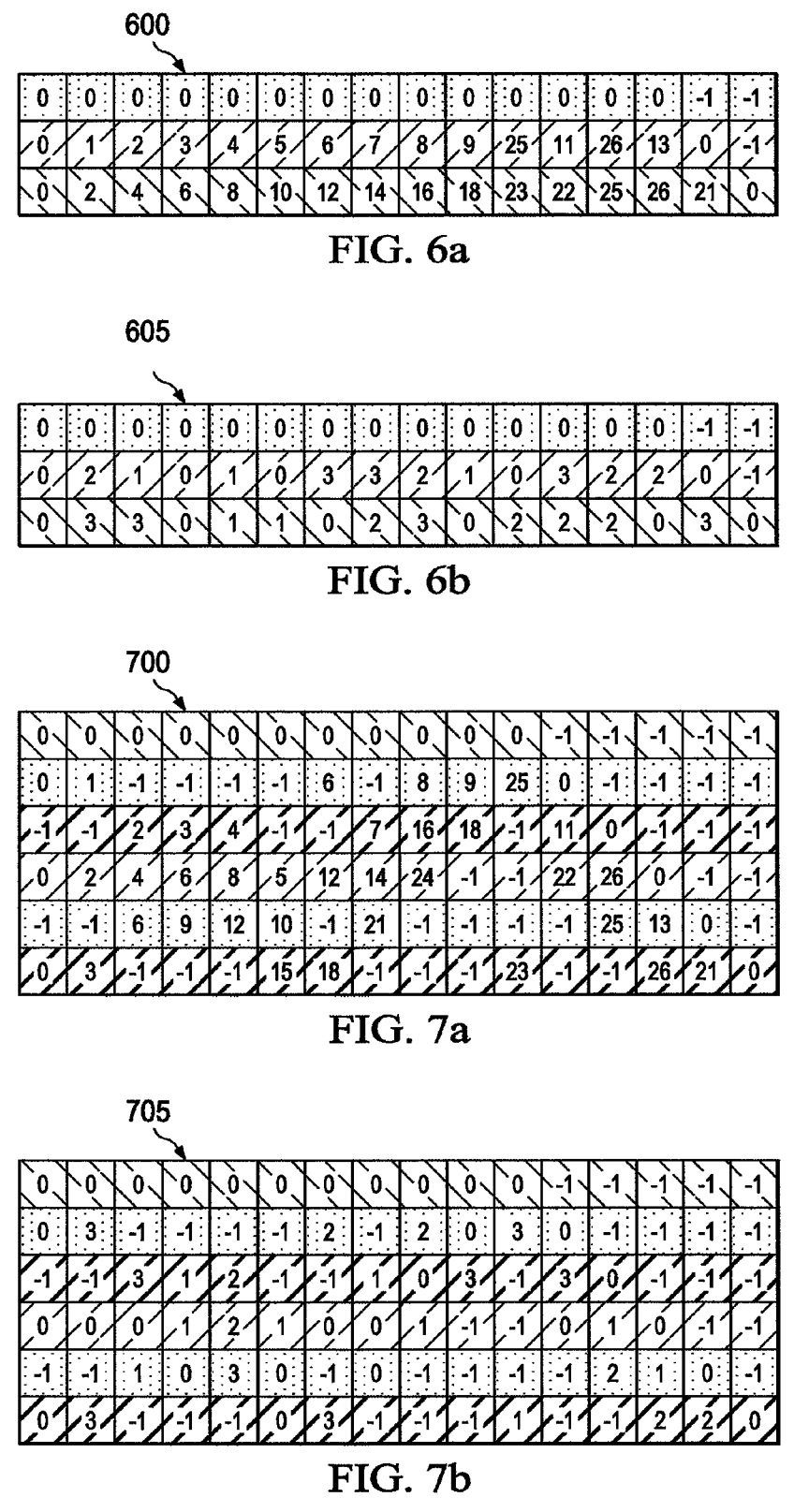

FIGS. 6A&B illustrate rate $^{13}/_{16}$ LDPC codes of lengths 432 and 1728 in accordance with the present disclosure. Base matrix 600 is an example of 432 bit length LDPC code with rate $^{13}/_{16}$ and parallelization factor of 27. The protograph for the rate-$^{13}/_{16}$ LDPC code has 3 rows and 16 columns and is designed using a protograph-based EXIT analysis which satisfies the design constraints discussed above and achieves a low SNR threshold. The three rows insure that the resultant code is decodable in at most three layers.

The protograph is lifted using the same relative shifts used in the rate-$^{3}/_{4}$ LDPC code of base matrix 500. As a result, the same hardware in shift module 415 may be used to decode both the rate-$^{3}/_{4}$ LDPC code and the rate-$^{13}/_{16}$ LDPC code. Additionally, the values can be adjusted to increase the minimum distance and the size of the smallest cycle. Lifting matrix 605 can be used to lift base matrix 600 to create length 1728 LDPC code in a manner similar to that discussed above with regard to FIGS. 5A&B.

FIGS. 7A&B illustrate rate $^{5}/_{8}$ LDPC codes of lengths 432 and 1728 in accordance with an illustrative embodiment of the present disclosure. Base matrix 700 is an example of 432 bit length LDPC code with rate $^{5}/_{8}$ and parallelization factor of 27. The protograph for the rate-$^{5}/_{8}$ LDPC code has 6 rows and 16 columns and is designed using a protograph-based EXIT analysis which satisfies the design constraints discussed above and achieves a low SNR threshold.

The protograph is lifted using the same relative shifts used in the rate-$^{3}/_{4}$ LDPC code of base matrix 500. As a result, the same hardware in shift module 415 may be used to decode both the rate-$^{3}/_{4}$ LDPC code and the rate-$^{5}/_{8}$ LDPC code. Additionally, the values can be adjusted to increase the minimum distance and the size of the smallest cycle. Lifting matrix 705 can be used to lift base matrix 700 to create length 1728 LDPC code in a manner similar to that discussed above with regard to FIGS. 5A&B.

Given the lower code rate, base matrix 700 includes more rows than base matrices 500 and 600. However, careful design of base matrix 700 produces LDPC code that is still 4-layer decodable. For example, the second and the fifth rows in base matrix 700 are contention free and can be decoded in parallel. Also, the third and the sixth rows can be decoded in parallel. Thus, a codeword encoded according to base matrix 700 this code can be decoded in four layers. In the first layer, check-node processor 410 can process the first row. In the second layer, check-node processor 410 processes the second and fifth rows. In the third layer, check-node processor 410 processes the third and sixth rows. Then in the fourth layer, check-node processor 410 processes the fourth row. Additionally, the layers can be processed in any other order. In this illustrative example, the similarly shaded rows are contention free and can be processed in parallel.

Figures 8A, 8B:
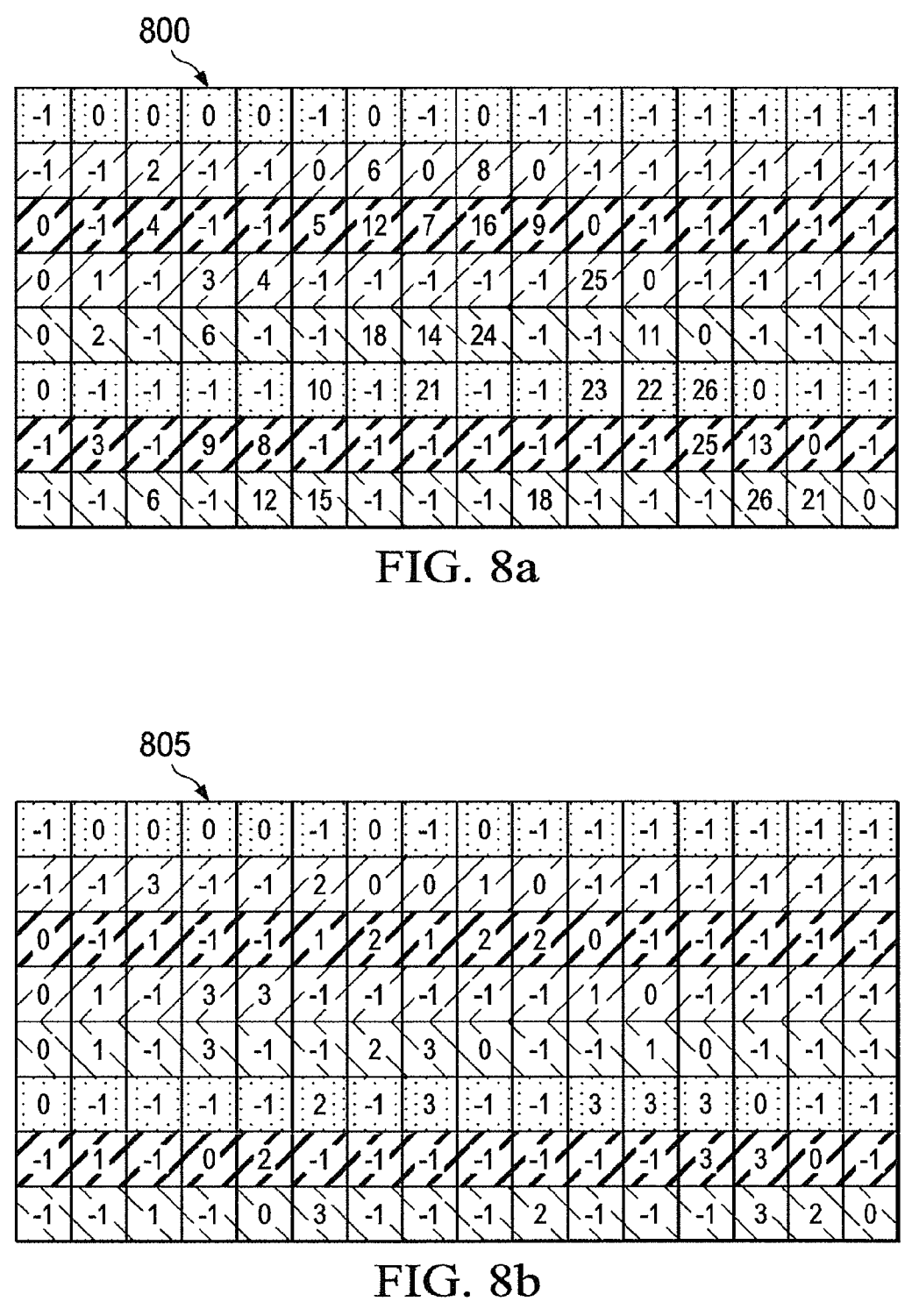

FIGS. 8A&B illustrate rate $^{1}/_{2}$ LDPC codes of lengths 432 and 1728 in accordance with an illustrative embodiment of the present disclosure. Base matrix 800 is an example of 432 bit length LDPC code with rate $^{1}/_{2}$ and parallelization factor of 27. The protograph for the rate-$^{1}/_{2}$ LDPC code has 8 rows and 16 columns and is designed using a protograph-based EXIT analysis which satisfies the design constraints discussed above and achieves a low SNR threshold.

The protograph is lifted using the same relative shifts used in the rate-$^{3}/_{4}$ LDPC code of base matrix 500. As a result, the same hardware in shift module 415 may be used to decode both the rate-$^{3}/_{4}$ LDPC code and the rate-$^{1}/_{2}$ LDPC code. Additionally, the values can be adjusted to increase the minimum distance and the size of the smallest cycle. Lifting matrix 805 can be used to lift base matrix 800 to create length 1728 LDPC code in a manner similar to that discussed above with regard to FIGS. 5A&B.

Additionally, as discussed above, similarly shaded rows are contention free and can be processed in parallel. Thus, despite having eight rows a codeword encoded according to base matrix 800 can still be decoded in four layers.

Figures 9A, 9B:
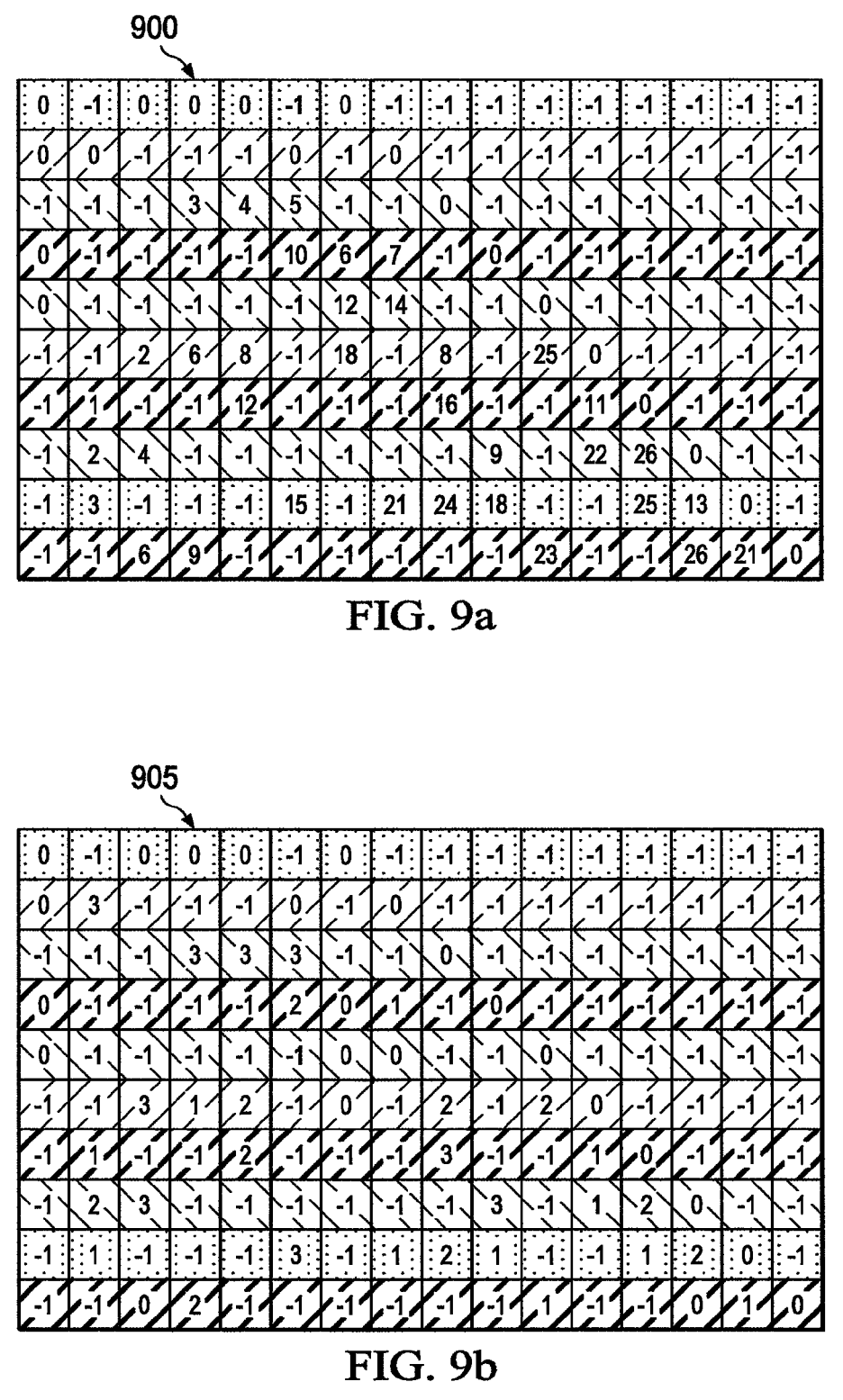

FIGS. 9A&B illustrate rate $^{3}/_{8}$ LDPC codes of lengths 432 and 1728 in accordance with an illustrative embodiment of the present disclosure. Base matrix 900 is an example of 432 bit length LDPC code with rate $^{3}/_{8}$ and parallelization factor of 27. The protograph for the rate-$^{3}/_{8}$ LDPC code has 10 rows and 16 columns and is designed using a protograph-based EXIT analysis which satisfies the design constraints discussed above and achieves a low SNR threshold.

The protograph is lifted using the same relative shifts used in the rate-$^{3}/_{4}$ LDPC code of base matrix 500. As a result, the same hardware in shift module 415 may be used to decode both the rate-$^{3}/_{4}$ LDPC code and the rate-$^{3}/_{8}$ LDPC code. Additionally, the values can be adjusted to increase the minimum distance and the size of the smallest cycle. Lifting matrix 905 can be used to lift base matrix 900 to create length 1728 LDPC code in a manner similar to that discussed above with regard to FIGS. 5A&B.

Additionally, as discussed above, similarly shaded rows are contention free and can be processed in parallel. Thus, despite having ten rows a codeword encoded according to base matrix 900 can still be decoded in four layers.

Figure 10:
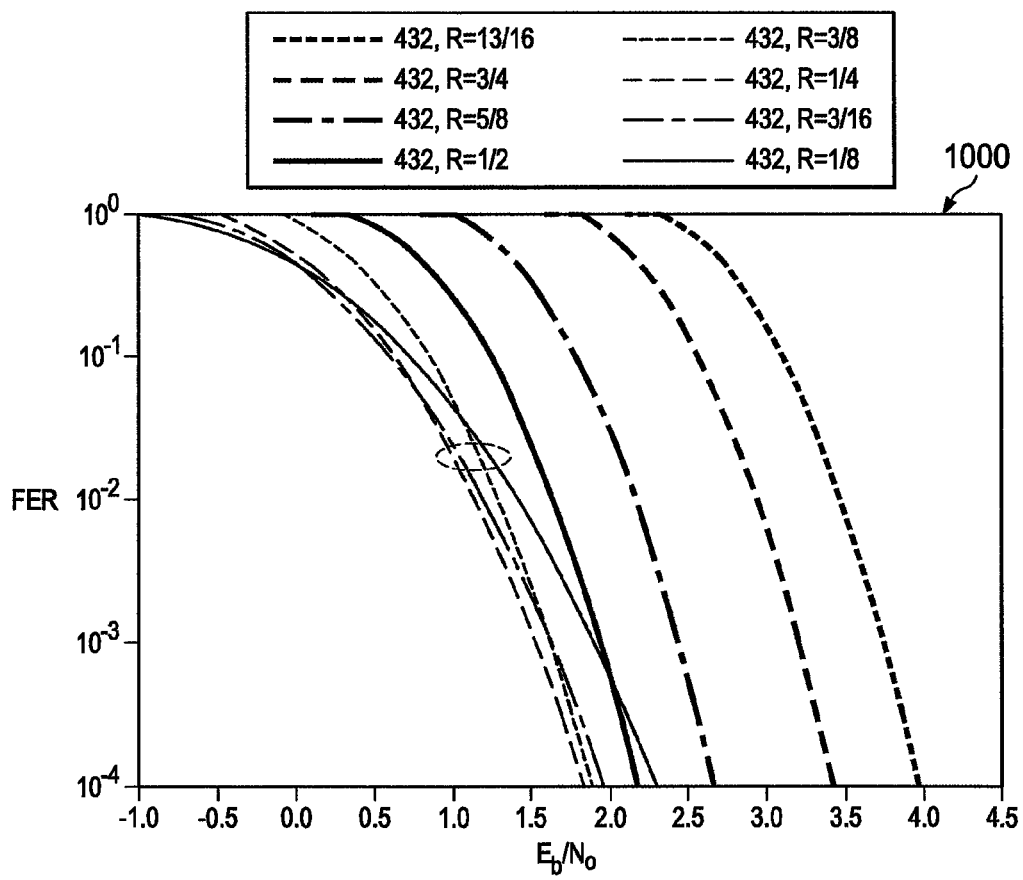
FIG. 10 illustrates a graph of frame error rates for LDPC codes of various rates.

FIG. 10 illustrates a graph of frame error rates for LDPC codes of various rates. Graph 1000 illustrates the theoretical random-coding bound (RCB) for linear codes with length 432 and rates $^{1}/_{8}$, $^{3}/_{16}$, $^{1}/_{4}$, $^{3}/_{8}$, $^{1}/_{2}$, $^{5}/_{8}$, $^{13}/_{16}$. Graph 1000 illustrates that for 432 code length there is no significant coding gain for codes with low rates of $^{1}/_{4}$, $^{3}/_{16}$, and $^{1}/_{8}$ over codes with higher rates of $^{3}/_{8}$ and $^{1}/_{2}$. Similar relationships exist for RCB of codes of length 1728.

The different illustrative embodiments recognize that additional redundant information transmitted in low rate codes can be used to increase the power in a received signal without the need to increase the transmit power. Such additional power in a received signal can be advantageous in poor channel conditions. Additionally, based on the RCB coding gains illustrated in graph 1000, using low rate codes does not significantly reduce coding performance.

As a result, different illustrative embodiments of the present disclosure derive low-rate LDPC codes of rates $^{1}/_{4}$, $^{3}/_{16}$, and $^{1}/_{8}$ from higher rate $^{3}/_{8}$ and $^{1}/_{2}$ LDPC codes. As a result the designed low rate codes are compatible with the frame structure proposed for MMB communications and can be decoded using the same hardware used as the high-rate LDPC codes.

Figure 11:
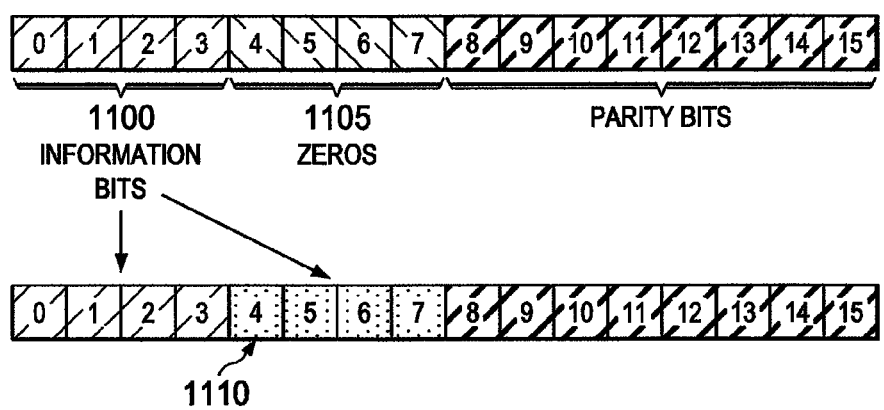
FIG. 11 illustrates a process for constructing rate 1/4 LDPC code in accordance with an illustrative embodiment of the present disclosure.

FIG. 11 illustrates a process for constructing rate ¼ LDPC code in accordance with an illustrative embodiment of the present disclosure. In this illustrative embodiment, rate-¼ linear block code (e.g., LDPC code) can be derived from the rate-½ linear block code. First information (input data) bits 1100, which are equal to one fourth of the code length, are concatenated with an equal number of zeros 1105. The concatenated bits are encoded using a systematic rate-½ linear block code encoder. For example, a same encoder used to encode the rate-½ code described in FIGS. 8A&B. Then in output codeword 1110 zeros 1105 are replaced with information bits 1100.

For example, a ¼ rate 432-bit length code can be encoded as discussed above with 108 information bits copied to 108 zeros. In another example, a ¼ rate 1728-bit length code can be encoded as discussed above with 432 information bits copied to 432 zeros.

Figure 12:
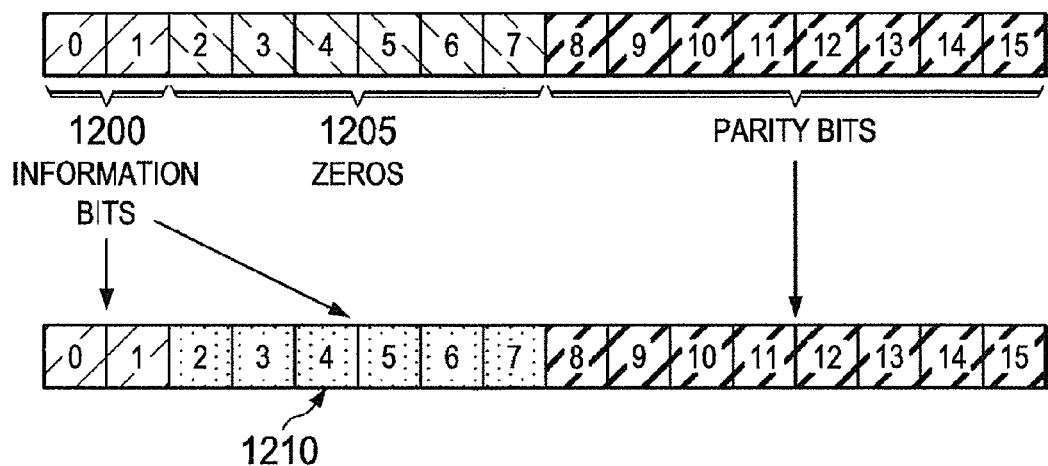
FIG. 12 illustrates a process for constructing rate 1/8 LDPC code in accordance with an illustrative embodiment of the present disclosure.

FIG. 12 illustrates a process for constructing rate ⅛ LDPC code in accordance with an illustrative embodiment of the present disclosure. In this illustrative embodiment, rate-⅛ linear block code (e.g., LDPC code) can be derived from the rate-½ linear block code. First information (input data) bits 1200, which are equal to one eighth of the code length, are concatenated with number of zeros 1205 equals to three eighth of the code. The concatenated bits are encoded using a systematic rate-½ linear block code encoder. For example, a same encoder used to encode the rate-½ code described in FIGS. 8A&B. Then in output codeword 1210 zeros 1205 are replaced with three copies of the information bits 1200.

For example, a ⅛ rate 432-bit length code can be encoded as discussed above with 54 information bits copied three times to 162 zeros. In another example, a ⅛ rate 1728-bit length code can be encoded as discussed above with 216 information bits copied three times to 648 zeros.

Figure 13:
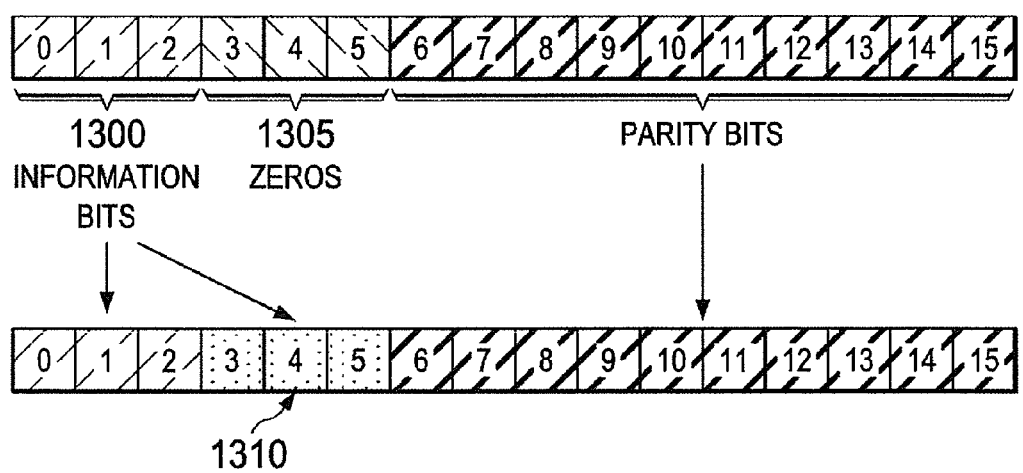
FIG. 13 illustrates a process for constructing rate 3/16 LDPC code in accordance with an illustrative embodiment of the present disclosure.

FIG. 13 illustrates a process for constructing rate 3/16 LDPC code in accordance with an illustrative embodiment of the present disclosure. In this illustrative embodiment, rate-3/16 linear block code (e.g., LDPC code) can be derived from the rate-⅜ linear block code. First information (input data) bits 1300, which are three sixteenths the code length, are concatenated with an equal number of zeros 1305. The concatenated bits are encoded using a systematic rate-⅜ linear block code encoder. For example, a same encoder used to encode the rate-⅜ code described in FIGS. 9A&B. Then in output codeword 1310 zeros 1305 are replaced with information bits 1300.

For example, a 3/16 rate 432-bit length code can be encoded as discussed above with 81 information bits copied to 81 zeros. In another example, a 3/16 rate 1728-bit length code can be encoded as discussed above with 648 information bits copied to 648 zeros.

In other illustrative embodiments of the present disclosure, rates ¼, ⅛, and 3/16 code can be derived using additional methods. For example, one can interleave the information bits in the copied positions. In another example, one can scramble the information bits in the copied position. In other examples, one can partially/fully negate or interleave and partially/fully negate the information bits in the copied positions based on an a priori known pattern. In yet other examples, one can concatenate the original information data with any a priori known pattern of '1's and '0's prior to encoding and then to replace the pattern with any of the methods above.

In yet other illustrative embodiments, one can duplicate the original information bits based on the rate (2× for rate ¼, 4× for rate ⅛, etc.) prior to encoding. The duplication padding can be done with any of the methods above.

Additionally, different illustrative embodiments of the present disclosure decode the low-rates codes described above. For example, upon the receiving a codeword encoded using the rate-¼, rate-3/16, or rate-⅛ codes described above (which consists of soft information bits, soft repeated information bits, and soft parity bits), decoder 400 can decode the received codeword. For example, decoder 400 may add the values of the soft information bits to their corresponding values of the soft repeated information bits. Then, decoder 400 may replace the repeated information bits with strong soft zero-bits (e.g., large positive number "+inf"). Then, decode the codeword formed by the addition of the soft information bits and soft repeated information bits.

Figure 14:
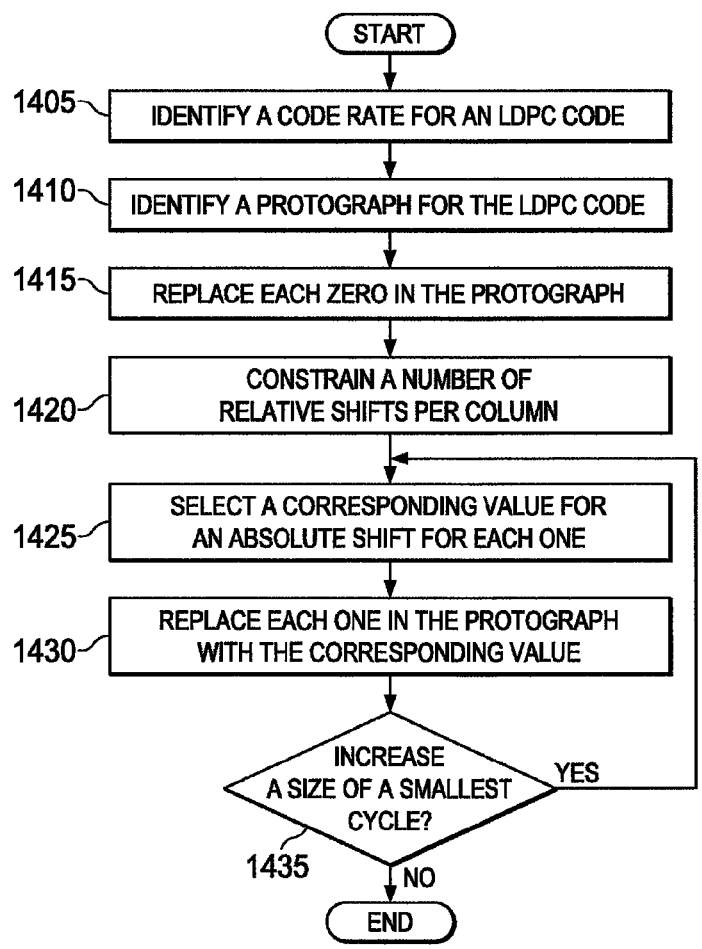
FIG. 14 illustrates a process for constructing a family of LDPC codes in accordance with an illustrative embodiment of the present disclosure.

FIG. 14 illustrates a process for constructing a family of LDPC codes in accordance with an illustrative embodiment of the present disclosure. The process may be performed by an encoder such as for example channel coding and modulation block 205 in FIG. 2.

The process begins by identifying a code rate for an TDPC code (block 1405). In block 1405, the code rates of the family of codes may include rate-⅜ code, rate-½ code, rate-⅝ code, rate-¾ code, and rate-13/16 code.

The process then identifies a protograph for the LDPC code (block 1410). In block 1410, the process may identify the protograph by calculating a number of variable nodes for the protograph based on utilization of a critical path of check nodes in the protograph and setting a column weight of less than or equal to four for each code rate in the family of LDPC codes such that LDPC codewords encoded using the family of LDPC codes are decodable in less than or equal to four layers. Additionally, the protograph may be constructed using an EXIT analysis to achieve a lowest SNR threshold possible. Thereafter, the process replaces each zero in the protograph with a '−1' (block 1415).

The process then constrains a number of relative shifts per column (block 1420). In block 1420, the number of relative shifts may be constrained to one.

Thereafter, the process selects a corresponding value for an absolute shift for each one (block 1425). In block 1425, the values may be selected to maintain the single relative shift while reducing a size of a smallest cycle and increasing a minimum distance of the LDPC code. The process then replaces each one in the protograph with the corresponding value (block 1430).

Thereafter, the process determines whether a size of a smallest cycle can be increased (block 1435). If the size of the smallest cycle can be increased, the process returns to block 1425 and selects one or more new values for one or more ones in the protograph. If the size of the smallest cycle cannot be increased, the process terminates with the LDPC code for the identified code rate constructed.

Figure 15:
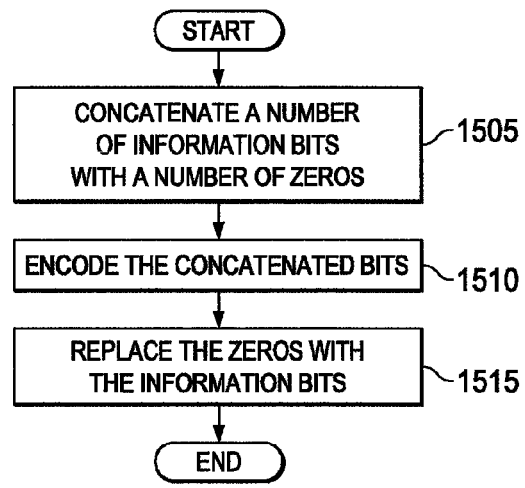
FIG. 15 illustrates a process for constructing a low-rate LDPC code in accordance with an illustrative embodiment of the present disclosure.

FIG. 15 illustrates a process for constructing a low-rate LDPC code in accordance with an illustrative embodiment of the present disclosure. The process may be performed by an encoder such as for example channel coding and modulation block 205 in FIG. 2.

The process begins by concatenating a number of information bits with a number of zeros (block 1505). In block 1505, the low-rate code is constructed from higher-rate code. The process then encodes the concatenated bits (block 1510). In block 1510, the bits may be encoded using a same encoder as used to encode the higher-rate code. Thereafter, the process replaces the zeros with the information bits (block 1515), with the process terminating thereafter. In block 1515, the encoded code word includes additional redundant information beyond the parity bits. When decoded, the additional redundant can be added to the original information to increase a power of the original information without increasing the transmit power used to transmit the encoded codeword. Additionally, the low-rate code may have similar coding performance of higher-rate codes; thus, increasing perceived transmit power without sacrificing significant change in performance.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for constructing a family of low-density-parity-check (LDPC) codes, the method comprising:
   identifying a code rate for an LDPC code in the family;
   identifying a protograph for the LDPC code; and
   constructing a base matrix for the LDPC code, the base matrix constructed by:
      replacing each zero in the protograph with a '−1';
      selecting a corresponding value for an absolute shift for each one in the protograph based on constraining a number of relative shifts per column of the LDPC code to one and increasing a size of a smallest cycle in a graph of the LDPC code; and
      replacing each one in the protograph with the corresponding value.

2. The method of claim 1, wherein determining the protograph for the LDPC code comprises:
   calculating a number of variable nodes for the protograph based on utilization of a critical path of check nodes in the protograph.

3. The method of claim 1, wherein determining the protograph for the LDPC code comprises:
   setting a column weight of less than or equal to four for each code rate in the family of LDPC codes, wherein LDPC codewords encoded using the family of LDPC codes are decodable in three or four layers.

4. The method of claim 1, wherein the LDPC code has a length of 432 bits and further comprising:
   constructing a 1728-bit length LDPC code having the code rate by lifting the base matrix for the LDPC code of length 432 by a lifting factor of four.

5. The method of claim 4, wherein constructing the 1728-bit length LDPC code comprises:
   cyclically shifting one or more absolute shift values in the lifted base matrix to increase minimum distance and reduce a number of cycles having a smallest size in a graph of the 1728-bit length LDPC code.

6. The method of claim 1, wherein constructing the base matrix for the LDPC code further comprises:
   constructing the base matrix such that permutation of columns in the base matrix results in a similar code error performance.

7. The method of claim 1, wherein determining the protograph for the LDPC code comprises:
   identifying a parallelization factor based on a balance between parallel processing of layers in the base matrix and sharing of information between parity checks in the processing of the layers in the base matrix.

8. The method of claim 7, wherein the LDPC code is a first LDPC code and further comprising:
   determining a second protograph for second LDPC code in the family having a second code rate; and
   lifting the second protograph using a same set of relative shift values from the base matrix for the first LDPC code, wherein each LDPC code in the family of LDPC codes have different code rates and a common set of circulant permutations.

9. The method of claim 8, wherein code rates of the LDPC codes in the family include rate-⅜ code, rate-½ code, rate-⅝ code, rate-¾ code, and rate-13/16 code and wherein the parallelization factor is 27.

10. The method of claim 1 further comprising:
    transmitting a codeword encoded using the base matrix of the LDPC code in a millimeter-wave wireless communications network.

11. A decoder configured to decode a low-density-parity-check (LDPC) codeword, the decoder comprising:
    a storage device configured to receive the LDPC codeword; and
    a check node processor configured to decode the LDPC codeword by iteratively processing layers of an LDPC code constructed by:
       identifying a protograph for the LDPC code; and
       constructing a base matrix for the LDPC code, the base matrix constructed by:
          replacing each zero in the protograph with a '−1';
          selecting a corresponding value for an absolute shift for each one in the protograph based on constraining a number of relative shifts per column of the LDPC code to one and increasing a size of a smallest cycle in a graph of the LDPC code; and
          replacing each one in the protograph with the corresponding value.

12. The decoder of claim 11 further comprising:
    a number of variable nodes, wherein the number of variable nodes is selected based on utilization of a critical path in the check node processor.

13. The decoder of claim 11, wherein the check node processor further configured to decode the LDPC codeword by iteratively processing the LDPC code in three or four layers.

14. The decoder of claim 11 further comprising:
    a shift module configured to apply a single relative-shift to layers of the LDPC code being processed.

15. The decoder of claim 11, wherein the LDPC code has a length of one of 432-bits and 1728-bits, wherein the base matrix is constructed using a parallelization factor of 27, wherein the LDPC code is part of a family of LDPC codes, and wherein code rates of the LDPC codes in the family include rate-⅜ code, rate-½ code, rate-⅝ code, rate-¾ code, and rate-13/16 code.

16. A method for constructing a low-rate low-density-parity-check (LDPC) code, the method comprising:
    concatenating a number of information bits with a number of zeros to form a set of concatenated bits;
    encoding the concatenated bits using an encoder configured to encode LDPC codewords having a code rate that is larger than a code rate of the low-rate LDPC code to form an LDPC codeword; and
    replacing the zeros in the LDPC codeword with the information bits.

17. The method of claim 16, wherein replacing the zeros in the LDPC codeword with the information bits comprises:
    replacing the zeros with one copy of the information bits, wherein the number of the information bits and the number of zeros are equal, wherein the encoder is configured to encode LDPC codewords having a code rate that is twice the code rate of the low-rate LDPC code, wherein the low-rate LDPC code has a code rate of one of ¼-rate and 3/16-rate, and wherein the low-rate LDPC code is constructed from high-rate LDPC code having a code rate of one of ½-rate and ⅜-rate.

18. The method of claim 16, wherein replacing the zeros in the LDPC codeword with the information bits comprises:
replacing the zeros with three copies of the information bits, wherein the number of zeros is three times the number of the information bits, wherein the encoder is configured to encode LDPC codewords having a code rate that is four times the code rate of the low-rate LDPC code, wherein the low-rate LDPC code has a code rate of one of ⅛-rate, and wherein the low-rate LDPC code is constructed from high-rate LDPC code having a code rate of one of ½-rate.

19. The method of claim 16 further comprising:
responsive to identifying poor channel conditions, increasing a power of a received signal by decreasing a code rate of a transmitted LDPC codeword.

20. The method of claim 16, wherein the low-rate LDPC code has a length of one of 432-bits and 1728-bits, wherein the low-rate LDPC code is part of a family of low-rate LDPC codes, and wherein code rates of the low-rate LDPC codes in the family include rate-⅛ code, rate-³⁄₁₆ code, and rate-¼ code.

\* \* \* \* \*